United States Patent [19]

Tailliet

[11] Patent Number: 5,717,323
[45] Date of Patent: Feb. 10, 1998

[54] RESISTANCE REFERENCE CIRCUIT

[75] Inventor: François Tailliet, Epinay sur Seine, France

[73] Assignee: SGS-Thomson Microelectronics S.A., Saint Genis, France

[21] Appl. No.: 576,881

[22] Filed: Dec. 21, 1995

[30] Foreign Application Priority Data

Dec. 23, 1994 [FR] France ................... 94 15553

[51] Int. Cl.⁶ ................................... G05F 1/648
[52] U.S. Cl. ........................... 323/297; 323/353
[58] Field of Search .................. 338/7, 8, 9, 10; 323/297, 352, 353, 354

[56] References Cited

U.S. PATENT DOCUMENTS

| | | | |
|---|---|---|---|
| 3,624,481 | 11/1971 | Macharg | 320/39 |
| 4,173,734 | 11/1979 | Hirasawa et al. | 323/8 |
| 4,300,395 | 11/1981 | Shirouzu et al. | 73/708 |
| 4,510,813 | 4/1985 | Kanazawa | 73/766 |
| 4,668,932 | 5/1987 | Drori et al. | 338/48 |
| 4,788,521 | 11/1988 | Johnson | 338/3 |
| 5,243,297 | 9/1993 | Perkins et al. | 324/700 |

FOREIGN PATENT DOCUMENTS

A-42 38 114  5/1993  Germany ............... H01L 23/58

OTHER PUBLICATIONS

Patent Abstracts of Japan, vol. 006, No. 092 (P-119) May 29, 1982 & JP-A-57 028227 (Seiko Epson Corp.) Feb. 15, 1982.

*Primary Examiner*—Adolf Berhane
*Attorney, Agent, or Firm*—Wolf, Greenfield & Sacks, P.C.; James H. Morris; Richard F. Giunta

[57] ABSTRACT

The present invention describes a resistance reference circuit that includes a reference resistor that is substantially independent of temperature variations to which the resistance reference circuit is subjected. Also provided is a resistor network that may be dependant upon the temperature variations, and a current source circuit that provides first and second currents to the reference resistor and the resistor network. A circuit that is responsive to voltages developed across the reference resistor and the resistor network modifies the resistance value of the resistor network such that its resistance value is maintained the same as that of the reference resistor.

66 Claims, 4 Drawing Sheets

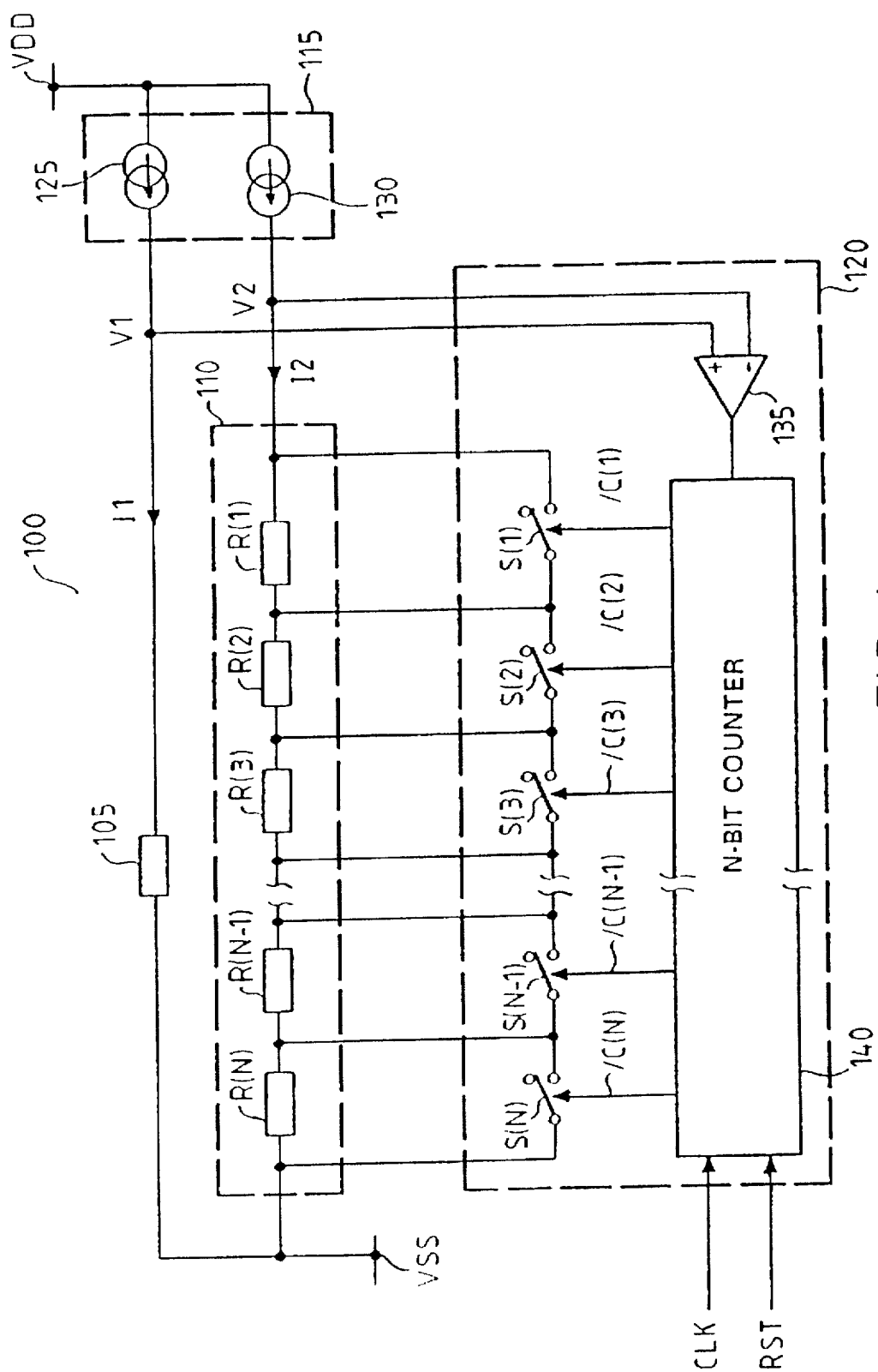
FIG_1

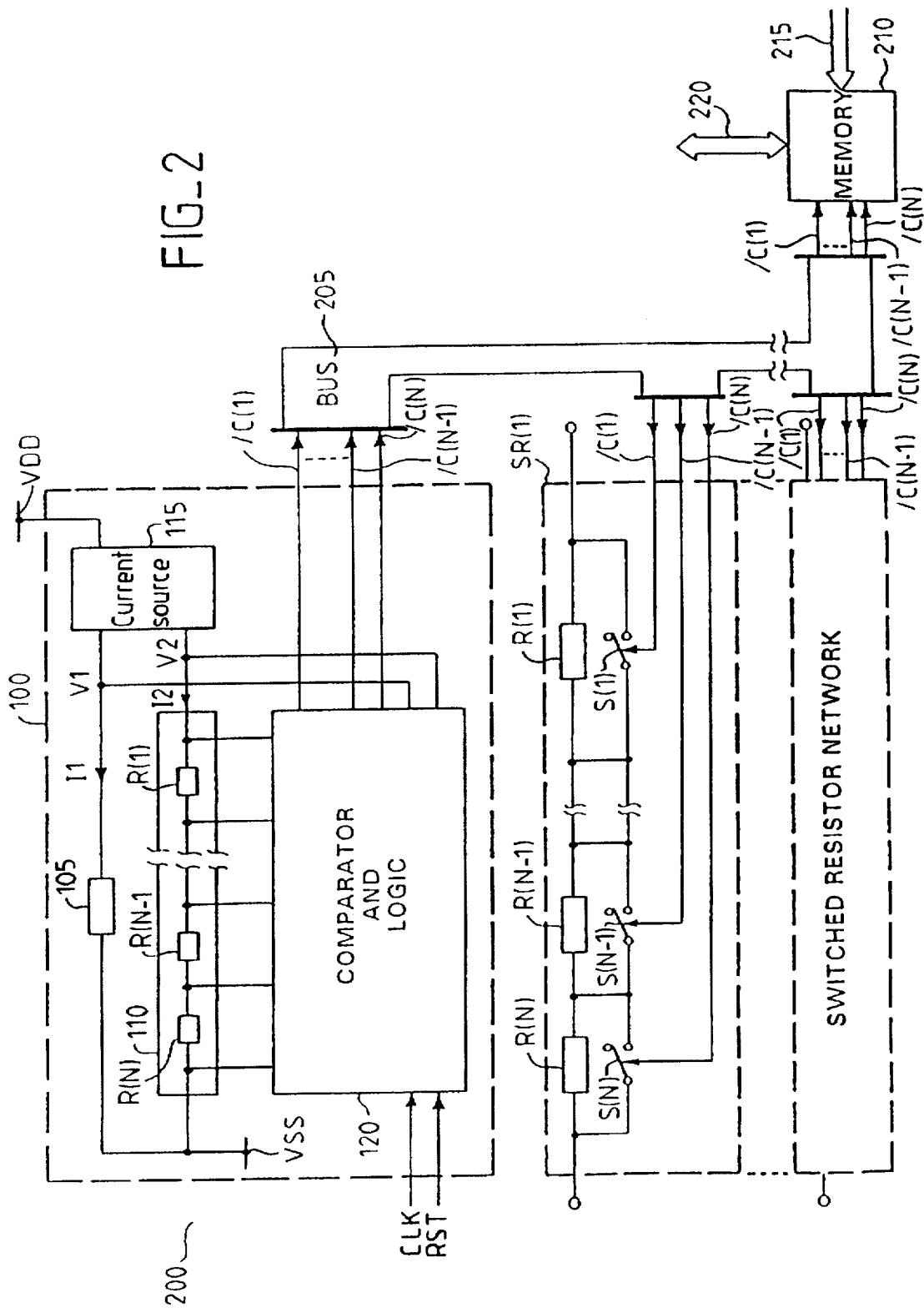
FIG_2

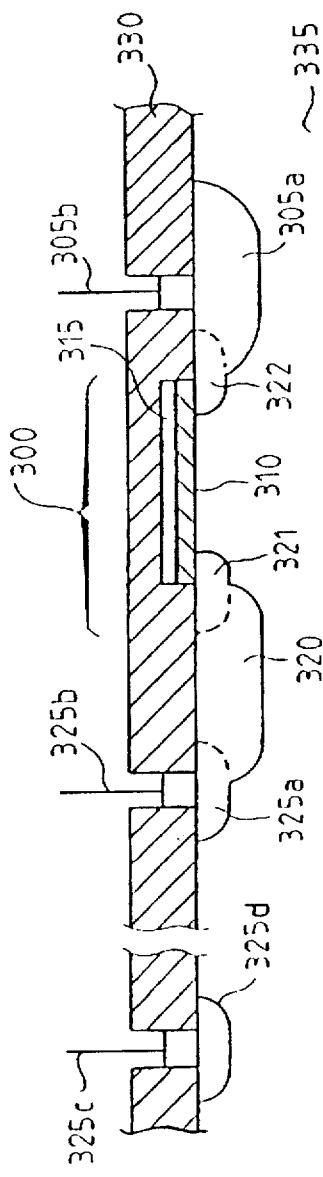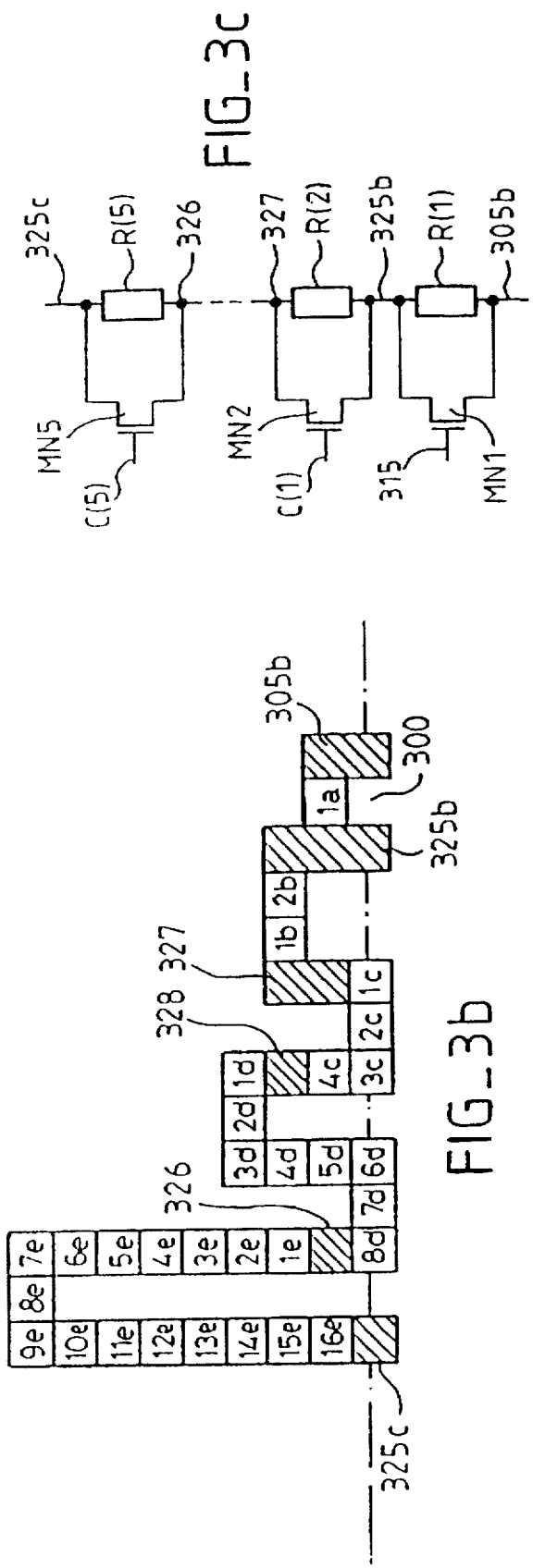

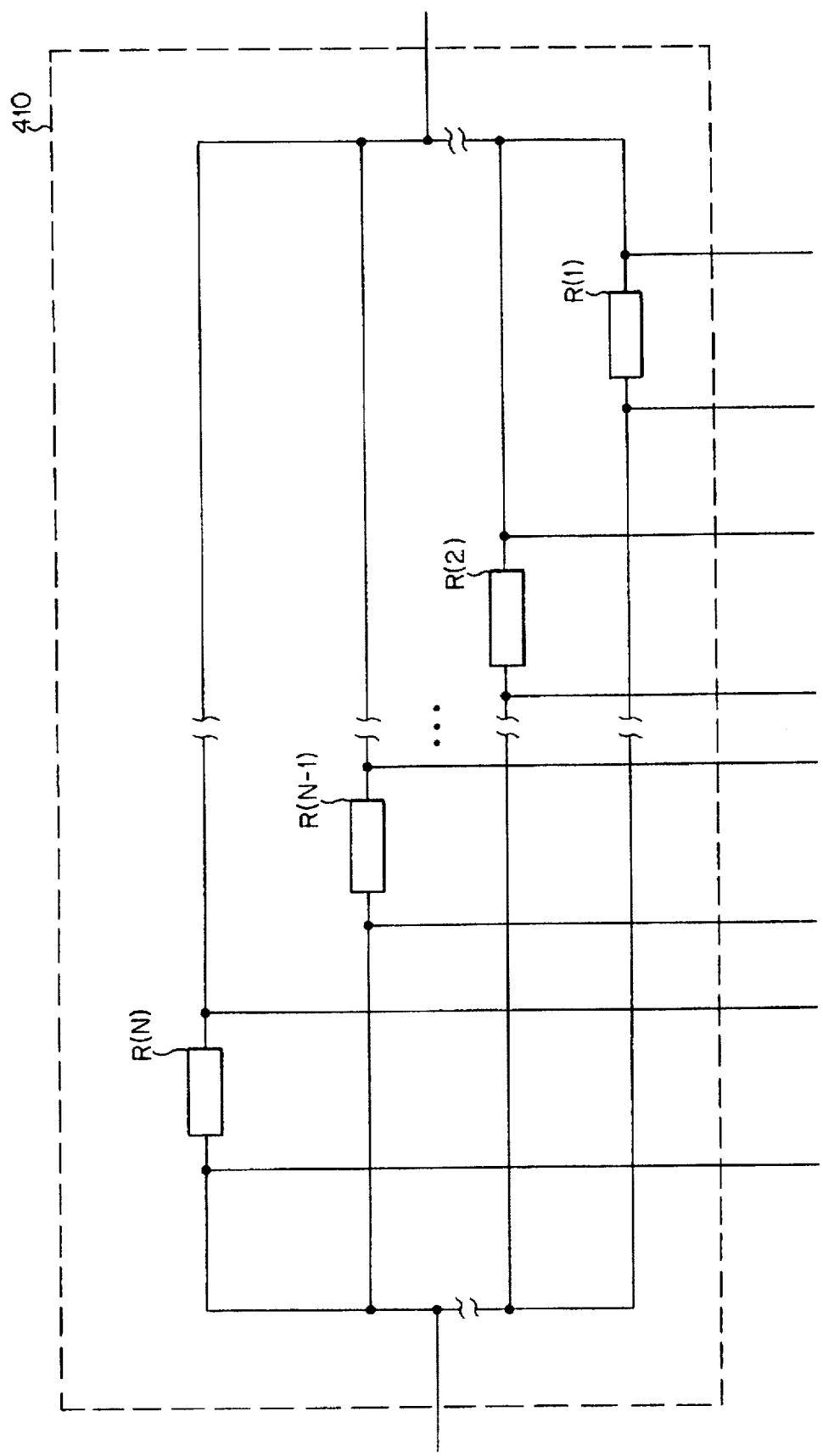
FIG_4

RESISTANCE REFERENCE CIRCUIT

BACKGROUND OF THE INVENTION

1. Field of the Invention

The present invention relates to a resistance reference circuit. More particularly, the present invention relates to a resistance reference circuit that maintains substantially constant values of resistance within an integrated circuit (IC) as a physical factor, e.g., the temperature,of the IC varies.

2. Discussion of the Related Art

It is well known how to fabricate diffused or ion implanted resistors in the art of semiconductor manufacturing. It is also well known in this art that the resistance value versus temperature variation of a highly diffused or strongly ion implanted resistor varies less than that of lightly diffused or weakly ion implanted resistors.

However, to integrate into an IC resistors that have large resistance values, i.e. resistors having resistance values greater than approximately 5K Ohms, that have low temperature sensitivity characteristics, or in other words a low variation of resistance over a specified temperature, or another factor, range, requires that they have a large surface. As a matter of fact, when zones are highly diffused the resistivity of these zones is weak. This can lead to a substantial increase in the die area of an IC that has a number of these types of resistors, even when these resistors are meandered.

The required resistor value R is known by those skilled in the art to be proportional to the sheet resistance $R_S$, for a given surface geometry. Thus, for a given value of $R_S$, the value R can be increased by increasing the surface geometry of the resistor. Alternatively, for a given surface geometry, it is known by those skilled in the art that the value R can be adjusted by altering the value of $R_S$. The value of $R_S$ can be adjusted by any one, or combination, of known methods, including altering: the doping concentration; the diffusion depth; the doping profile(s); the annealing temperature and/or annealing time.

It would be advantageous to have an optimum surface geometry for the required resistors and then vary the required resistance values of these resistors by any one, or combination, of the above mentioned methods. However, for a given geometry there are disadvantages associated with the known methods of fabricating such resistors. Notably, it would be difficult to increase the value of the resistors by reducing the diffusion/implantation depth to anything less than approximately 0.1 µm due to 'pinching' effects. Besides, a lightly doped high value resistor will suffer from the disadvantage of having a substantial variation of resistance with changes in temperature. The annealing times and/or temperatures may not be compatible with other integrated passive and/or active components. The fabrication of such resistors add additional process steps.

For example, in U.S. Pat. No. 3,902,926 (Perloff et al), a method of making an ion implanted resistor having a controlled temperature coefficient is taught. However, the disadvantage of such a method is that the fabrication and processing steps associated with the manufacture of such a resistor are excessive and complex, as is also the case with respect to U.S. Pat. No. 3,947,866 (Stellrecht).

Accordingly, an object of the present invention is to provide a resistance reference circuit that is substantially independent of a physical factor, that can compensate for changes in the physical factor such that resistors within an associated system which are dependant upon the physical factor can be compensated so as to take into account changes in the physical factor.

Another object of the present invention is to provide a resistance reference system that can be used to determine if an associated system has been subjected to the physical factor beyond its specified range.

SUMMARY OF THE INVENTION

In one illustrative embodiment of the present invention, a resistance reference circuit is provided that comprises a reference resistor that is substantially independent of a physical factor, for example temperature, the power supply voltage, the dispersion of the manufacturing process, to which the resistance reference circuit is subjected, a resistor network that is dependant upon said physical factor, a current source circuit for respectively providing first and second currents to the reference resistor and the resistor network, and a means that is responsive to voltages developed across the reference resistor and the resistor network for modifying the resistance value of the resistor network such that the resistance value of the resistor network is substantially maintained at a level corresponding to that of the reference resistor.

According to another embodiment of the present invention, the current source circuit includes first and second current sources that respectively provide the first and second currents that are, preferably, substantially the same even with changes in the physical factor.

According to another embodiment of the present invention, the resistor network comprises a plurality of series connected resistors.

According to another embodiment of the present invention, the resistor network comprises a plurality of parallel connected resistors.

According to another embodiment of the present invention, the means includes a comparator that is responsive to the voltages developed across the reference resistor and the resistor network and a plurality of switches that are respectively connected to resistors of the resistor network, said switches being controlled by the comparator.

According to other embodiments of the present invention, the means includes a counter, for example a binary up/down counter, that is responsive to a clock or count signal and also a reset signal for resetting the counter to a predetermined count value and the output of the comparator.

According to another embodiment of the present invention, the control of the plurality of switches is relayed via a data bus.

According to other embodiments of the present invention, a storage element is connected to the data bus. The storage, i.e. memory, element being for example an EPROM, EEPROM or Flash EEPROM or any other suitable storage means.

According to other embodiments of the present invention, one or more other switched resistor networks are foreseen and are preferably modified in unison with the said resistor network.

According to other embodiments, the resistor network and/or these other switched resistor networks preferably constitute the drain and/or source extension of an MOS type transistor.

According to other embodiments of the present invention, the resistor values of the switched resistor network and/or the resistors of the other switched resistor networks are binary weighted, preferably progressively.

BRIEF DESCRIPTION OF THE DRAWINGS

These and other objects, as well as other advantages and features, of the present invention will become apparent in light of the following detailed description and accompanying drawings, that are intended to be non-limiting, in which:

FIG. 1 illustrates a block diagram of an embodiment of a resistance reference circuit according to the invention;

FIG. 2 illustrates a block diagram of an embodiment of a resistance reference system according to the invention;

FIG. 3a illustrates an embodiment of an MOS transistor having a drain extension that corresponds to a resistor according to the invention;

FIG. 3b illustrates an embodiment of a top view of a meandered weighted resistors network according to the invention;

FIG. 3c illustrates an equivalent circuit diagram of that of FIG. 3a; and

FIG. 4 illustrates a block diagram of an embodiment of a resistor network according to the invention.

DETAILED DESCRIPTION

FIG. 1 illustrates a block diagram of an embodiment of a resistance reference circuit according to the invention. The resistance reference circuit 100 includes a reference resistor 105, a resistor network 110, a current source circuit 115 and a control circuit 120 that acts as a comparator and logic circuit. The reference resistor 105 and resistor network 110 each have an input and an output.

In this particular embodiment, the current source circuit 115 comprises two current sources 125, 130, which are supplied from a positive voltage source VDD. These sources respectively supply the currents I1 and I2 to the inputs of the reference resistor 105 and the resistor network 110. The outputs of the reference resistor 105 and resistor network 110 are connected to another, in an example lower, voltage source VSS. The current source circuit 115 is able to source currents I1, I2 that are substantially the same, even over a large physical factor, for example temperature, variation. It is possible that the current source circuit 115 can be implemented for example by a current mirror (not illustrated) or any other suitable arrangement that is known to those skilled in the art.

The resistor network 110 is illustrated as comprising a plurality of series connected resistors R(1), R(2) ... R(N−1), R(N). The reference resistor 105 is illustrated as comprising a single resistor. The resistor network 110 includes two or more resistors, for example R(1)–R(32), whereas the reference resistor 105 can be formed by one or more resistors. The form and nature of the reference resistor 105 and resistor network 110 will be discussed in more detail hereinafter.

In one embodiment, the control circuit 120 includes a comparator 135, a counter 140 and a plurality of switches S(1), S(2) ... S(N−1), S(N). The comparator 135 compares the voltages developed across the reference resistor 105 and resistor network 110. For example, the positive input terminal of the comparator 135 receives a voltage V1, which corresponds to the voltage developed across the reference resistor 105. A voltage V2, which corresponds to the voltage developed across the resistor network 110, is supplied to the negative input terminal of the comparator 135.

Thus, when the voltage V1 is greater than the voltage V2, the output of the comparator has a logic 1 state. Since, as stated above, I1 is substantially the same as I2, the value of resistance of the network 110 is less than that of the reference resistor 105. Alternatively, when the voltage V2 is greater than the voltage V1, the output of the comparator has a logic 0 state, which means that the value of resistance of the network 110 is greater than that of the reference resistor 105.

The counter 145, which in one embodiment is preferably a progressive binary weighted up/down counter, receives the output of the comparator 135 and a count signal, i.e. a clock signal CLK, and preferably a reset signal RST. The signal CLK is used to 'count'into the counter 140 a current logic state present at the output of the comparator 135. For example, each time the signal CLK appears and the output of the comparator 135 has a logic 1 state, the counter increases its count value by one least significant bit (LSB). However, if the comparator 135 has a logic 0 state, the counter decreases its count value by one LSB. The counter 140 is provided with N outputs providing N control signals C(1), C(2) ... C(N−1), C(N), each of which individually controls a switch S(1), S(2) ... S(N−1), S(N). These N control outputs provide signals that correspond to the $2^N$ possible binary states of the counter 140. The frequency of the clock can be regular, irregular or determined by the user and/or system. The signal RST is used to reset the counter, for example during the power up phase of the system, such that it has a predetermined count value, for example 0.

In one embodiment the N switches are connected in series with one another. They are also respectively connected in parallel with each of the N resistors of the resistor network 110. The switches can therefore be manipulated by the control signals C(1) ... C(N−1), C(N) of the counter 140 such that they alter the resistance value of the resistor network 110 by either short-circuiting or not short-circuiting their associated parallel connected resistor. Preferably the switches are even controlled by /C(N) complementary signals of the control signals C(N). For example, switch S(1) is connected in parallel with resistor R(1) and controlled by the control signal /C(1) of the counter 140. The switch S(2), which is connected in series between switches S(1) and S(3), is connected in parallel with resistor R(2), which is connected in series between resistors R(1) and R(3). The switch S(2) is controlled by the control signal /C(2) of the counter 140; and so on. The switches can be implemented by either suitably connected and controlled CMOS transmission gates or by suitably connected and controlled n-type or p-type MOS transistors.

The reference resistor 105 should be such that its variation of resistance is as small as possible when there is a large variation of a physical factor, i.e. temperature. For example, a typical small variation of resistance is 1% over the temperature range −55° C. to +125° C. Such a resistor can be manufactured on an IC for example by means of a highly diffused or strongly ion implanted resistor, or any other method of producing such a resistor that is known to those skilled in the art. However, a highly diffused or a strongly ion implanted reference resistor 105 that has a large resistance value will, as stated above, occupy a large surface area with respect to an equivalent lightly diffused or weakly ion implanted resistor. Yet, this area will be of little significance with respect to the overall die area since in one embodiment of the present invention only one of these resistors 105 is required. This reference resistor 105 can be such that it has a resistance value of 10K Ohms, for example, at a temperature of T=25° C.

The resistor network 110, on the other hand, can be implemented by a plurality of lightly diffused or weakly ion implanted resistors which will inherently occupy a smaller die area than an equivalent highly diffused or strongly ion implanted resistor. It is preferable that these lightly diffused or weakly ion implanted resistors have values that are progressively binary weighted. For example, the network 110 can comprise eight resistors, i.e. N=8, wherein: R(1)= 62.5 Ohms, R(2)=[2.R(1)], R(3)=[4.R(1)] ... R(8)=[128.R (1)], at a temperature of T=25° C. Thus the network 110 has a resistance range, at T=25° C., from approximately 62.5 Ohms, which corresponds to resistor R(1), to 15.9K Ohms, which corresponds to resistors R(1) to R(8) connected in series.

As stated above, it is known that the resistance values of lightly diffused or weakly ion implanted resistors varies substantially as a function of temperature. Nevertheless, the resistors that constitute the network 110 will all vary proportionally by the same amount. Therefore, the number of resistors (N) chosen to represent the network 110 and their respective weightings can be such that they can accurately be selected by the controller 120 so as to substantially correspond, or be proportional, to the resistance value (10K Ohms) of the reference resistor 105 for the maximum possible temperature variation.

In order to exemplify the operation of the diagram of FIG. 1, an example is described in which the following initial conditions exist after power-up: T=25° C.; resistor 105 has a resistance value of 10K Ohms; N=8;R(1)=62.5 Ohms, R(2)=[2.R(1)], R(3)=[4.R(1)]. . . R(8)=[128.R(1)]=8K Ohms; all the switches except switches S(8) and S(6) are closed; and the clock CLK and reset RST signals are inactive.

For the purposes of the example, it is assumed that the temperature increases to T=100° C. and that the network resistors have increased their resistance values by 15% for a change in temperature from T=25° C. to T=100° C., i.e. the resistors of the network 100 have a positive temperature coefficient (of course they could equally have a negative temperature coefficient), and that over the same temperature change the reference resistance changes by only 0.5%. Therefore, the value of R(1) changes from 62.5 Ohms (at 25° C.) to approximately 71.87 Ohms (at 100° C.). It follows then that since all of the resistors of the network 110 have the same temperature coefficient R(2)=2.R(1)≈143.7 Ohms ... R(8)=128.R(1)≈9.2K Ohms. The value of the reference resistance changes from 10K Ohms to 10.05K Ohms and such a change can be regarded as being negligible.

In this example, the counter 140 will not count if it does not receive a clock pulse, no matter what the state of the output of the comparator 135. So assuming that no clock signal CLK, or reset signal RST, has been received by the counter during the temperature change from T=25° C. to T=100° C., the resistance value of the network 110 is equivalent to the sum of the series connected resistors R(8), i.e. approximately 9.2K Ohms, and R(6), i.e. approximately 2.3K Ohms, all the other resistors being short-circuited by their respective parallel connected switches. So, at T=100° C. the resistance of the reference resistor has a value of 10.05K Ohms whilst the resistance network 110 has an overall resistance value of approximately (128+32).R(1)= 160.(71.87 Ohms)=11.5K Ohms. Therefore, since I1 is substantially equal to I2, the voltage V2 will be greater than the voltage V1 so that the output of the comparator will be a logic 0 state.

If a clock signal arrives in this situation, this clock signal CLK will 'count' the output of the comparator 135 into the counter, i.e. a logic 0 state, such that it reduces the counter value by one LSB so that the overall resistance of the network 110 now equals 159.R(1)=159.(71.87 Ohms) ≈11.428K Ohms. This value of network resistance is still higher than that of the reference resistor which means that the output state of the comparator is still a logic 0 because V2 is still greater than V1. Another clock signal arrives which again reduces the counter by one more LSB. Again, however, the voltage V2 is greater than the voltage V1.

If it is assumed that the frequency of the clock is 1 Hz, for example, the counter 140 will count down until the resistance value of the network 110 is less than that of the reference resistor 105, i.e. until the value of the voltage V1 is greater than that of V2. The counter would then increase the count value until V2 is greater than that of V1 and then count down again and so on.

It is conceivable that the resistance value of the network 110 can be left to oscillate around that of the reference resistor. However, in practice it is preferable that the comparator 135, or controller 140 has some means, for example hysterisis, so as to stop the network resistance value oscillating around that of the reference resistor. Therefore, in a practical situation, the output of the counter would have the binary value 10001011 least significant bit on the right, that is equivalent to the decimal value 139 which gives a network resistance value of 139.(71.87 Ohms)≈9.99K Ohms, which is within the required precision limits.

FIG. 2 illustrates a block diagram of an embodiment of a resistance reference system according to the invention. The resistance reference system includes the resistance reference circuit 100 of FIG. 1, a data bus 205, one or more other switched resistor networks SR(1) ... SR(X), where X can be an integer greater than or equal to 2, and a memory 210.

In one embodiment, the control signals C(1) ... C(N-1), C(N) of circuit 100 are driven by a bus 205 for routing them around the system.

The other switched resistors networks SR(1) ... SR(X) are distributed at various locations throughout the system and can be remote from the resistance reference circuit 100. Each of these other switched resistors networks SR(1) ... SR(X) includes a resistor network and its associated parallel connected switches that respectively correspond to the resistor network 110 and N switches S(1) ... S(N-1), S(N) of FIG. 1. The switched resistors networks SR(1) ... SR(X) are controlled by the counter 140 in accordance with the operation of the network 110 and switches (S1) ... S(N-1), S(N) of FIG. 1. Therefore, the switched resistors networks SR(1) ... SR (X) can be controlled and thus configured such that their resistance values match that of the reference resistor 105. Alternatively, the resistor network 110 and/or switched resistor networks SR(1) ... SR(X) can be controlled, and thus configured, such that their resistance values are proportionally matched to that of the reference resistor 105.

The memory 210, which can be an EEPROM for example, can be used to store the output signals C(1) ... C(N-1), C(N). One of the benefits, for example, of storing this data is that the user can access the data stored in the memory 210, via its control and data buses respectively 215 and 220, so as to determine the maximum and/or minimum temperature that the IC attained. Alternatively, such a scheme can be incorporated into a system by the manufacturer of the IC, and perhaps unknown to the user, so that when one or more parts, which contain this system, are returned to the manufacturer due to failure, the manufacturer can determine whether or not the user exceed the maximum and/or minimum specified temperature ratings. This application can be important in determining if the customer is liable for rendering the parts inoperable, whether completely or partially inoperable. Many other related applications will be apparent to those skilled in the art, for example: verification of temperatures utilised during burn-in, evaluating process variations of wafer lots, etc.

The switched resistors networks SR(1) . . . SR(X) can be used within a variety of circuits, for example, as references in bandgap circuits, in operational amplifier etc. They may also be used within the current source 115 of FIGS. 1 and 2 or even within the memory 210 of FIG. 2.

FIG. 3a illustrates an embodiment of a MOS transistor having a drain extension that corresponds to a resistor. More particularly, FIG. 3a illustrates the cross sectional view of an n-type MOS transistor 300 that has a drain extension 321 and a source extension 322. These extensions correspond to lightly doped regions. FIG. 3a also shows a diffused zone 325a–325d that corresponds to a resistor network which is manufactured at the same time, with the same process steps as the drain and source extensions 321 and 322. The method of producing a MOS transistor, either n-type or p-type, with a drain, and/or source, extension that corresponds to a resistor is known to those skilled in the art. However, the present invention broadens this principle by including a switched weighted drain extension resistor network and/or a switched weighted source extension resistor network. In this exemplary illustration of an n-type MOS transistor 300, the source, source metalisation, gate oxide, gate, drain, drain extension serving as resistor and drain extension metalisation regions respectively correspond to the regions referenced 305a, 305b, 310, 315, 320, 325a, 325b. The field oxide layer and the substrate respectively correspond to regions 330 and 335.

The drain extension region 325a, which is placed on the side of the drain opposite that which faces the transistors channel, corresponds to the closest drain 320. In this example, the remotest part of that same drain extension region is designated by 325d. Regions 325b and 325c respectively correspond to drain extension metalisation regions of regions 325a and 325d. One advantage of using a drain extension region, apart from the fact that the drain extension resistor network can be manufactured at the same time as the drain region, is that it increases the breakdown capability of the resistor and transistor.

FIG. 3b illustrates an embodiment of a top view of a meandered progressive binary weighted resistor network. In this particular example, a 5-bit binary weighted resistor is shown. It has appropriate metal contacts that are shown by the cross hatched regions 305b, 325b, 327, 328, 326 and 325. These metal contacts are made at each extreme of the resistor and correspond to those of FIG. 3a. Resistor R(1) is represented by the square 1a and resistor R(2)=2*R(1) is represented by the squares 1b and 2b, and so on, resistor R(5) being represented by the sixteen squares 1e to 16e. Thus the length of the drain extension governs the resistance value of the resistor, all other variable parameters of course being fixed.

FIG. 3c illustrates an equivalent circuit diagram of that of FIG. 3a, i.e. an n-type MOS transistor MN1 equivalent to transistor 300, with a series weighted drain extension resistor network. For each resistor, a switch, in the form of a transistor, may be placed in parallel. For example, resistor R(5) has an n-type transistor MN5 placed in parallel with it, transistor MN5 being controlled via its gate by the control output C(5), resistor R(1) has an n-type transistor MN1 placed in parallel with it, transistor MN1 being controlled via its gate 315 by the control signal /C(1). FIG. 3a is a cut view, along the trace shown on FIG. 3b. The transistor 300-MN1 is shown in parallel with resistor 1a.

Although this invention has been described in connection with certain preferred embodiments, it should be understood that the present disclosure is to be considered as an exemplification of the principles of the invention and that there is no intention of limiting the invention to the disclosed embodiments. On the contrary, it is intended that all alternatives, modifications and equivalent arrangements as may be included within the spirit and scope of the appended claims be covered as part of this invention. For example, it is possible that the resistance value of the resistor networks SR(1) . . . SR(X) can be adjusted by connecting or not connecting their respective resistors in parallel as is done in the technique of a switched resistor ladder, as shown in resistor network 410 of FIG. 4. Alternatively, the networks 110, SR(1) . . . SR(X) can be implemented, and suitably controlled, with a mixture of series connected and parallel connected resistors according to the design needs and/or the necessity for manufacturing. Accordingly, the foregoing description is by way of example only, and is not intended to be limiting.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only, and not intended to be limiting. The invention is limited only as defined in the following claims and the equivalents thereto.

I claim:

1. A resistance reference circuit that is subject to a physical factor, the resistance reference circuit comprising:
    a reference resistor having a first terminal, a second terminal, and a resistance that is substantially independent of the physical factor to which the resistance reference circuit is subjected;
    a resistor network having a first terminal, a second terminal, and a resistance that is dependent upon the physical factor, the resistor network being adjustable to vary the resistance;
    a current source circuit having a first output coupled to the reference resistor to provide the reference resistor with a first current that generates a first voltage across the reference resistor, the current source circuit further having a second output coupled to the resistor network to provide the resistor network with a second current that generates a second voltage across the resistor network; and
    a comparator and logic circuit having a first input coupled to the first terminal of the reference resistor, a second input coupled to the first terminal of the resistor network, and an output, responsive to the first and second inputs and coupled to the resistor network, that adjusts the resistor network to maintain the resistance of the resistor network at a level corresponding to the resistance of the reference resistor despite variations in the physical factor.

2. The resistance reference circuit of claim 1, wherein the physical factor is temperature.

3. The resistance reference circuit of claim 1, wherein the current source circuit includes:
    a first current source that provides the first current; and a second current source that provides the second current to be substantially equal to the first current.

4. The resistance reference circuit of claim 1, wherein the resistor network includes a plurality of series connected resistors.

5. The resistance reference circuit of claim 1, wherein the resistor network includes a plurality of parallel connected resistors.

6. The resistance reference circuit of claim 1, wherein the resistor network includes a plurality of connected resistors, and wherein the comparator and logic circuit includes:
   a comparator having a first input coupled to the first terminal of the reference resistor, a second input coupled to the first terminal of the resistor network, and an output; and
   a plurality of switches coupled to and controlled by the output of the comparator, each of the plurality of switches being respectively coupled to one of the plurality of connected resistors.

7. The resistance reference circuit of claim 1, wherein the comparator and logic circuit includes a counter, coupled to the comparator and the resistor network, that controls the resistor network to maintain the resistance of the resistor network at a level corresponding to the resistance of the reference resistor.

8. The resistance reference circuit of claim 7, wherein the counter is a binary up/down counter.

9. The resistance reference circuit of claim 8, wherein the counter is responsive to a clock signal, a reset signal, and the output of the comparator.

10. The resistance reference circuit of claim 6, further including a data bus that couples the plurality of the switches to the output of the comparator.

11. The resistance reference circuit of claim 10, further including a storage element that is coupled to the data bus.

12. The resistance reference circuit of claim 11, wherein the storage element is an EEPROM.

13. The resistance reference circuit of claim 10, wherein the resistor network is a first resistor network, and wherein the resistance reference circuit further includes a second resistor network coupled to the comparator and logic circuit and having an adjustable resistance, the adjustable resistance of the second resistor network being controlled in unison with the adjustable resistance of the first resistor network.

14. The resistance network of claim 13, wherein the second resistor network includes a resistor that is a drain extension of a MOS transistor.

15. The resistance network of claim 1, wherein the resistor network includes a resistor that is a drain extension of a MOS transistor.

16. The resistance network of claim 1, wherein the resistor network includes a plurality of connected resistors, and wherein each of the connected resistors has a resistance that is binary weighted with respect to another of the plurality of connected resistors.

17. The resistance network of claim 13, wherein the second resistor network includes a resistor that is a source extension of a MOS transistor.

18. The resistance reference circuit of claim 1, wherein the resistor network is a first resistor network, and wherein the resistance reference circuit further includes a second resistor network coupled to the comparator and logic circuit and having an adjustable resistance, the adjustable resistance of the second resistor network being controlled in unison with the adjustable resistance of the first resistor network.

19. The resistance network of claim 18, wherein the second resistor network includes a resistor that is a drain extension of a MOS transistor.

20. The resistance network of claim 18, wherein the second resistor network includes a resistor that is a source extension of a MOS transistor.

21. The resistance network of claim 1, wherein the resistor network includes resistor that is a source extension of a MOS transistor.

22. A method for providing a controlled resistance in an environment wherein at least one physical factor is variable, the method comprising the steps of:
   (A) providing a first resistive element having a resistance that is adjustable;
   (B) providing a second resistive element having a resistance that remains substantially constant despite variations in the at least one physical factor; and
   (C) adjusting the resistance of the first resistive element as the at least one physical factor varies to maintain the resistance of the first resistive element at a value that is substantially proportional to the resistance of the second resistive element.

23. The method of claim 22, wherein step (C) includes a step of adjusting the resistance of the first resistive element to be substantially equal to the resistance of the second resistive element.

24. The method of claim 22, wherein:
   step (A) includes providing a resistor network including a plurality of resistors coupled together, each of the plurality of resistors having a resistance that varies with variations in the at least one physical factor; and
   step (C) includes a step of short circuiting at least one of the plurality of resistors to lower the resistance of the first resistive element when the resistance of another of the plurality of resistors increases due to a variation in the at least one physical factor.

25. The method of claim 24, wherein the first resistive element provides a first controlled resistance, and wherein the method further includes the steps of:
   (D) providing a third resistive element having a resistance that is adjustable; and
   (E) adjusting the resistance of the third resistive element to be proportional to the resistance of the second resistive element so that the third resistive element provides a second controlled resistance.

26. The method of claim 25, wherein step (E) includes a step of adjusting the resistance of the third resistive element to be substantially equal to the resistance of the second resistive element.

27. The method of claim 26, wherein:
   step (C) includes a step of generating a control signal that controls the resistance of the first resistive element; and
   step (E) includes a step of adjusting the resistance of the third resistive element in response to the control signal.

28. The method of claim 22, wherein the at least one physical factor is temperature so that the controlled resistance is subjected to a range of temperatures in the environment, and step (B) includes a step of providing a resistive element having a resistance that remains substantially constant despite variations in temperature over the range of temperatures.

29. The method of claim 22, wherein step (A) includes the steps of:
   providing a plurality of resistors arranged in a network, each of the plurality of resistors having a first terminal and a second terminal; and
   providing a plurality of switches, each of the plurality of switches having a first terminal that is coupled to the first terminal of a corresponding one of the plurality of resistors and a second terminal that is coupled to the second terminal of the corresponding one of the plurality of resistors;
   and wherein step (A) includes controlling the plurality of switches.

30. The method of claim 22, further including a step of storing a value indicative of the resistance of the first resistive element.

31. The method of claim 22, further including the steps of:
(D) storing a history of adjustments made to the resistance of the first resistive element during a time period; and
(E) reviewing the history of adjustments made to the resistance of the first resistive element to identify changes in the at least one physical factor that occurred during the time period.

32. The method of claim 22, wherein the first resistive element provides a first controlled resistance, and wherein the method further includes the steps of:
(D) providing a third resistive element having a resistance that is adjustable; and
(E) adjusting the resistance of the third resistive element to be proportional to the resistance of the second resistive element so that the third resistive element provides a second controlled resistance.

33. The method of claim 32, wherein step (E) includes a step of adjusting the resistance of the third resistive element to be substantially equal to the resistance of the second resistive element.

34. The method of claim 33, wherein:
step (C) includes a step of generating a control signal that controls the resistance of the first resistive element; and
step (E) includes a step of adjusting the resistance of the third resistive element in response to the control signal.

35. An apparatus for providing a controlled resistance in an environment wherein at least one physical factor is variable, the apparatus comprising:
a first resistive element having a resistance that is adjustable;
a second resistive element having a resistance that remains substantially constant despite variations in the at least one physical factor; and
means, coupled to the first and second resistive elements, for adjusting the resistance of the first resistive element as the at least one physical factor varies to maintain the resistance of the first resistive element at a value that is substantially proportional to the resistance of the second resistive element.

36. The apparatus of claim 35, wherein the means for adjusting the resistance of the first resistive element includes means for adjusting the resistance of the first resistive element to be substantially equal to the resistance of the second resistive element.

37. The apparatus of claim 35, wherein:
the first resistive element includes a plurality of resistors coupled together, each of the plurality of resistors having a resistance that varies with variations in the at least one physical factor; and the means for adjusting includes means for short circuiting at least one of the plurality of resistors to lower the resistance of the first resistive element when the resistance of another of the plurality of resistors increases due to a variation in the at least one physical factor.

38. The apparatus of claim 37, wherein:
the first resistive element provides a first controlled resistance;
the apparatus further includes a third resistive element having a resistance that is adjustable; and
the means for adjusting the resistance of the first resistive element includes means, coupled to the third resistive element, for adjusting the resistance of the third resistive element to be proportional to the resistance of the second resistive element so that the third resistive element provides a second controlled resistance.

39. The apparatus of claim 38, wherein the means for adjusting the resistance of the third resistive element includes means for adjusting the resistance of the third resistive element to be substantially equal to the resistance of the second resistive element.

40. The apparatus of claim 39, wherein the means for adjusting the resistance of the first and third resistive elements include means for generating a control signal to control the resistance of each of the first and third resistive elements based upon the resistance of the second resistive element.

41. The apparatus of claim 40, wherein the physical factor is temperature so that the apparatus is subjected to a range of temperatures in the environment, and wherein the second resistive element includes a resistive element having a resistance that remains substantially constant despite variations in temperature over the range of temperatures.

42. The apparatus of claim 35, wherein the first resistive element includes:
a plurality of resistors arranged in a network, each of the plurality of resistors having a first terminal and a second terminal; and
a plurality of switches, each of the plurality of switches having a first terminal that is coupled to the first terminal of a corresponding one of the plurality of resistors and a second terminal that is coupled to the second terminal of the corresponding one of the plurality of resistors; and
wherein the means for adjusting includes means for controlling the plurality of switches.

43. The apparatus of claim 35, further including means, coupled to the means for adjusting, for storing a value indicative of the resistance of the first resistive element.

44. The apparatus of claim 35, further including means, coupled to the means for adjusting, for storing a history of adjustments made to the resistance of the first resistive element during a time period so that the history of adjustments can be reviewed to identify changes in the at least one physical factor that occurred during the time period.

45. The apparatus of claim 35, wherein:
the first resistive element provides a first controlled resistance;
the apparatus further includes a third resistive element having a resistance that is adjustable; and
the means for adjusting the resistance of the first resistive element includes means, coupled to the third resistive element, for adjusting the resistance of the third resistive element to be proportional to the resistance of the second resistive element so that the third resistive element provides a second controlled resistance.

46. The apparatus of claim 45, wherein the means for adjusting the resistance of the third resistive element includes means for adjusting the resistance of the third resistive element to be substantially equal to the resistance of the second resistive element.

47. The apparatus of claim 46, wherein the means for adjusting the resistance of the first and third resistive elements include means for generating a control signal to control the resistance of each of the first and third resistive elements based upon the resistance of the second resistive element.

48. The apparatus of claim 35, wherein the first resistive element includes a plurality of resistors disposed in a meandered arrangement.

49. The apparatus of claim 48 wherein the meandered arrangement is such that each of the plurality of resistors has a first terminal and a second terminal that is substantially adjacent the first terminal.

50. An apparatus comprising:

a first resistive element having a resistance that is adjustable;

a second resistive element having a resistance that remains substantially constant despite variations in at least one physical factor to which the apparatus is subjected; and a control circuit having a first input coupled to the first resistive element, a second input coupled to the second resistive element, and an output that adjusts the resistance of the first resistive element as the at least one physical factor varies so that the resistance of the first resistive element remains substantially proportional to the resistance of the second resistive element despite variations in the at least one physical factor.

51. The apparatus of claim 50, wherein the control circuit controls the first resistive element so that the resistance of the first resistive element is substantially equal to the resistance of the second resistive element.

52. The apparatus of claim 50 wherein the at least one physical factor is temperature so that the apparatus is subjected to a range of temperatures in the environment, and wherein the second resistive element has a resistance that remains constant despite variations in temperature over the range of temperatures.

53. The apparatus of claim 50, wherein the first resistive element includes:

a plurality of resistors, each of the plurality of resistors having a first terminal and a second terminal; and a plurality of switches, each of the plurality of switches having a first terminal that is coupled to the first terminal of a corresponding one of the plurality of resistors and a second terminal that is coupled to the second terminal of the corresponding one of the plurality of resistors, the plurality of switches being responsive to the output of the control circuit.

54. The apparatus of claim 53, wherein the first resistive element has a first terminal and a second terminal, wherein the second resistive element has a first terminal and a second terminal that is coupled to the second terminal of the first resistive element, wherein the apparatus further includes a current source that provides a first current to the first terminal of the first resistive element and a second current, that is substantially proportional to the first current, to the first terminal of the second resistive element, and wherein the control circuit further includes:

a comparator having a first input coupled to the first terminal of the first resistive element, a second input coupled to the first terminal of the second resistive element, and an output that is indicative of whether a voltage at the first comparator input is greater than a voltage at the second comparator input; and a controller having a data input coupled to the output of the comparator, and at least one output that controls the plurality of switches to increase the resistance of the first resistive element when the resistance of the first resistive element is less than the resistance of the second resistive element, and that controls the plurality of switches to decrease the resistance of the first resistive element when the resistance of the first resistive element is greater than the resistance of the second resistive element.

55. The apparatus of claim 54, wherein:

the output of the comparator is at a first voltage level when the voltage at the first input of the comparator is greater than the voltage at the second input of the comparator;

the output of the comparator is at a second voltage level when the voltage at the first input of the comparator is not greater than the voltage at the second input of the comparator; and the controller includes a counter that counts up when the output of the comparator is at the first level, and down when the output of the comparator is at the second level.

56. The apparatus of claim 54, wherein the at least one output of the controller includes a plurality of outputs, each of the plurality of outputs being connected to a corresponding one of the plurality of switches.

57. The apparatus of claim 50, further including a storage element, coupled to the control circuit, that stores information indicative of a history of adjustments made to the resistance of the second resistive element during a time period.

58. The apparatus of claim 50, wherein:

the first resistive element provides a first controlled resistance;

the apparatus further includes a third resistive element having a resistance that is adjustable; and the output of the control circuit adjusts the resistance of the third resistive element so that the resistance of the third resistive element is proportional to the resistance of the second resistive element whereby the third resistive element provides a second controlled resistance.

59. The apparatus of claim 50, wherein the first resistive element includes a plurality of resistors disposed in a meandered arrangement.

60. The apparatus of claim 59, wherein the meandered arrangement is such that each of the plurality of resistors has a first terminal and a second terminal that is substantially adjacent the first terminal.

61. A method for providing a constant resistance in an integrated circuit that is subjected to at least one physical factor that varies, the method comprising the steps of:

(A) providing a resistor network including a plurality of resistors capable of being arranged in a plurality of configurations that each creates a corresponding network resistance, each of the plurality of resistors having a resistance that varies with variations in the at least one physical factor; and (B) adjusting the configuration of the plurality of resistors to maintain the network resistance to be constant despite variations in the at least one physical factor.

62. The method of claim 61, further including a step of storing a value indicative of the configuration of the plurality of resistors.

63. The method of claim 61, further including the steps of:

(D) storing a history of adjustments made to the configuration of the plurality of resistors during a time period; and (E) reviewing the history of adjustments made to the configuration of the plurality of resistors to identify changes in the at least one physical factor that occurred during the time period.

64. An apparatus for providing a constant resistance in an integrated circuit that is subjected to at least one physical factor that varies, the apparatus comprising:

a resistor network including a plurality of resistors capable of being arranged in a plurality of configurations that each creates a corresponding network resistance, each of the plurality of resistors having a resistance that varies with variations in the at least one physical factor; and means for adjusting the configuration of the plurality of resistors to maintain the network resistance to be constant despite variations in the at least one physical factor.

65. The apparatus of claim 64, further including means, coupled to the means for adjusting, for storing a value indicative of the configuration of the plurality of resistors.

66. The apparatus of claim 64, further including means, coupled to the means for adjusting, for storing a history of adjustments made to the configuration of the plurality of resistors during a time period, so that the history of adjustments can be reviewed to identify changes in the at least one physical factor that occurred during the time period.

* * * * *